(12) United States Patent
Mahler et al.

(10) Patent No.: US 8,847,385 B2
(45) Date of Patent: Sep. 30, 2014

(54) CHIP ARRANGEMENT, A METHOD FOR FORMING A CHIP ARRANGEMENT, A CHIP PACKAGE, A METHOD FOR FORMING A CHIP PACKAGE

(75) Inventors: Joachim Mahler, Regensburg (DE); Ralf Wombacher, Burglengenfeld (DE); Anton Prueckl, Schierling (DE)

(73) Assignee: Infineon Technologies AG, Neubiberg (DE)

( * ) Notice: Subject to any disclaimer, the term of this patent is extended or adjusted under 35 U.S.C. 154(b) by 112 days.

(21) Appl. No.: 13/430,726

(22) Filed: Mar. 27, 2012

(65) Prior Publication Data

US 2013/0256855 A1 Oct. 3, 2013

(51) Int. Cl.
*H01L 23/34* (2006.01)
(52) U.S. Cl.
USPC ............................ 257/724; 257/723; 257/691
(58) Field of Classification Search
USPC ............................ 257/691, 723, 724, 686, 777
See application file for complete search history.

(56) References Cited

U.S. PATENT DOCUMENTS

| | | | |
|---|---|---|---|
| 6,300,146 B1 | 10/2001 | Thierry | |
| 6,979,909 B2 * | 12/2005 | Shinohara | 257/796 |
| 7,227,198 B2 | 6/2007 | Pavier et al. | |
| 7,884,444 B2 * | 2/2011 | Strzalkowski | 257/531 |
| 8,488,316 B2 * | 7/2013 | Zeng et al. | 361/690 |
| 8,519,532 B2 * | 8/2013 | Lenniger et al. | 257/712 |
| 2005/0161785 A1 * | 7/2005 | Kawashima et al. | 257/678 |
| 2007/0216011 A1 * | 9/2007 | Otremba et al. | 257/690 |
| 2008/0246137 A1 | 10/2008 | Mahler et al. | |
| 2010/0078832 A1 * | 4/2010 | Theuss | 257/787 |
| 2011/0298115 A1 * | 12/2011 | Celaya et al. | 257/676 |
| 2013/0049137 A1 * | 2/2013 | Uno et al. | 257/401 |

FOREIGN PATENT DOCUMENTS

DE   102006049949 B3   5/2008

\* cited by examiner

*Primary Examiner* — S. V. Clark

(57) ABSTRACT

A chip arrangement is provided, the chip arrangement including: a first chip carrier; a second chip carrier; a first chip electrically connected to the first chip carrier; a second chip disposed over the first chip carrier and electrically insulated from the first chip carrier; and a third chip electrically connected to the second chip carrier; wherein at least one of the first chip and the second chip is electrically connected to the third chip.

25 Claims, 10 Drawing Sheets

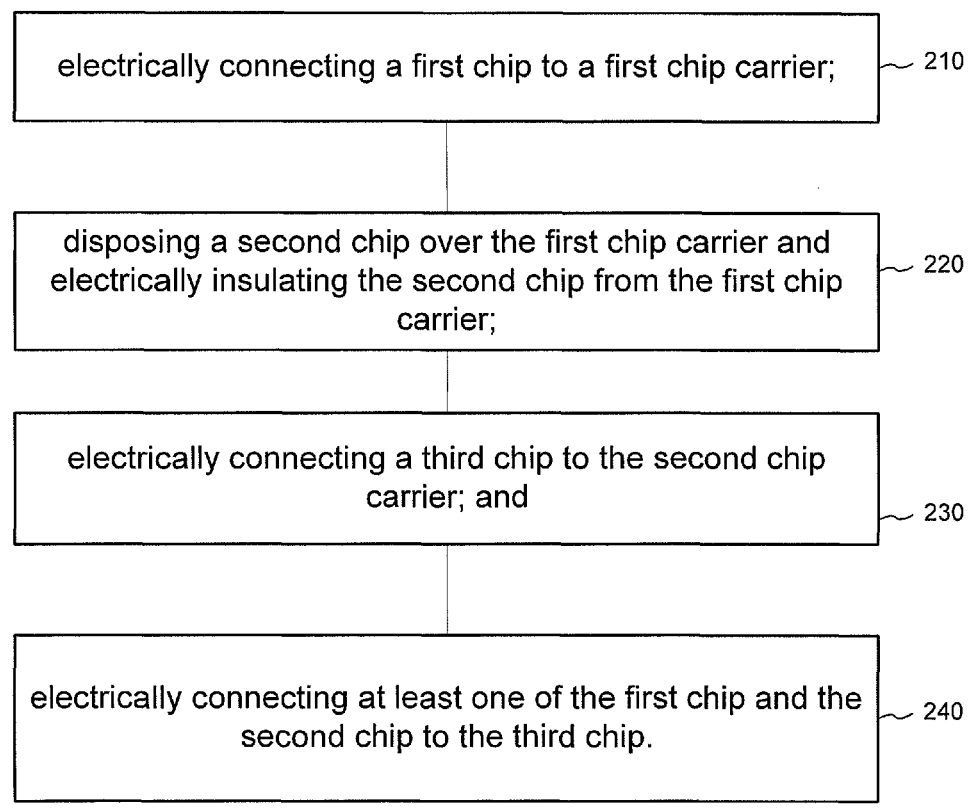

CHIP ARRANGEMENT, A METHOD FOR FORMING A CHIP ARRANGEMENT, A CHIP PACKAGE, A METHOD FOR FORMING A CHIP PACKAGE

TECHNICAL FIELD

Various embodiments relate generally to a chip arrangement, a method for forming a chip arrangement, a chip package, and a method for forming a chip package.

BACKGROUND

Constructing a chip package, e.g. a chip housing, may be challenging when the number of chips within a circuit is large. Chip housings may be provided for the packaging of one or more semiconductor chips, for example, if more than one power semiconductor chip or one or more logic integrated circuit chips are to be packaged as a single device. Traditionally, chip-on-chip construction may be used for the formation of multiple chip housings. For example, a back side of a logic integrated circuit chip may be glued to an electrically insulating medium over a side of the power semiconductor chip. Therefore, a logic integrated circuit chip may be attached to a power semiconductor chip over a shared die pad. The logic integrated circuit chip may be electrically insulated from the die pad and the power semiconductor chip. However, when more than one power semiconductor chip and one or more logic integrated chips are to be constructed in a housing, each chip may be packaged individually in a separate housing, and then electrically connected with each other over a single lead frame. Another option is a costly double copper bonded based housing wherein a plurality of power semiconductor chips with vertical current may each be bonded separately onto a separate metal layers, e.g. copper layers, onto a ceramic. The logic integrated circuit chips may either be fixed to another side of the ceramic side, or fixed onto, but electrically isolated from the separate metal layers.

SUMMARY

Various embodiments provide a chip arrangement, including: a first chip carrier; a second chip carrier; a first chip electrically connected to the first chip carrier; a second chip disposed over the first chip carrier and electrically insulated from the first chip carrier; and a third chip electrically connected to the second chip carrier; wherein at least one of the first chip and the second chip is electrically connected to the third chip.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows a method for forming a chip arrangement according to an embodiment;

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide a housing for multiple semiconductor chips, wherein multiple power semiconductor chips with vertical current flow and an integrated circuit logic chip may be housed over a single carrier within a housing.

Various embodiments provide a housing for multiple chips, wherein the housing may include a plurality of die pads, which may be electrically insulated from each other through an electrically insulating encapsulation mold.

Figure 1:
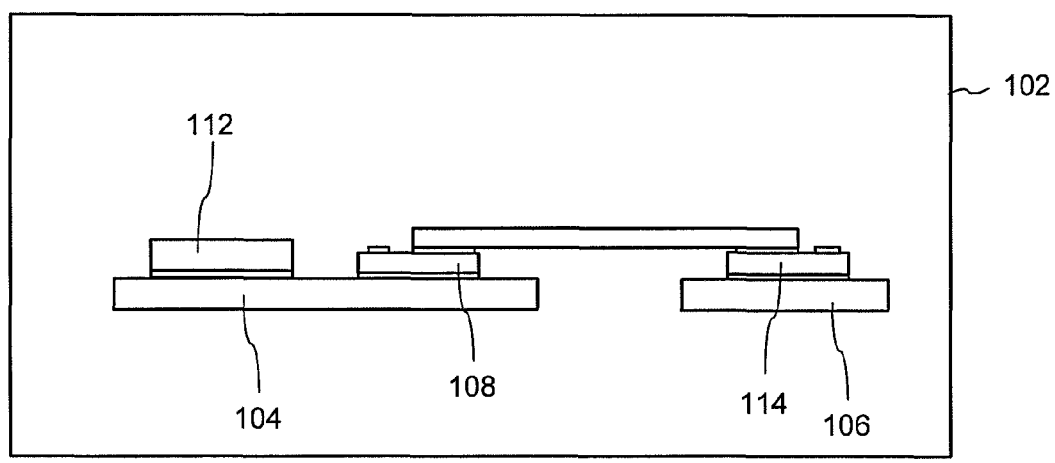
FIG. 1 shows a chip arrangement according to an embodiment.

FIG. 1 shows chip arrangement 102 according to an embodiment.

Chip arrangement 102 may include first chip carrier 104 and second chip carrier 106. Chip arrangement 102 may include first chip 108, e.g. a semiconductor chip, e.g. a semiconductor die, electrically connected to first chip carrier 104. Chip arrangement 102 may include second chip 112, e.g. a semiconductor chip, e.g. a semiconductor die, disposed over first chip carrier 104 and electrically insulated from first chip carrier 104; and third chip 114, e.g. a semiconductor chip, e.g. a semiconductor die, electrically connected to second chip carrier 106; wherein at least one of first chip 108 and second chip 112 is electrically connected to third chip 114.

FIG. 2 shows method 200 for forming a chip arrangement according to an embodiment. Method 200 may include:

electrically connecting a first chip to a first chip carrier (in 210);

disposing a second chip over the first chip carrier and electrically insulating the second chip from the first chip carrier (in 220);

electrically connecting a third chip to the second chip carrier (in 230); and electrically connecting at least one of the first chip and the second chip to the third chip (in 240).

FIGS. 3A to 3D show a method for forming a chip arrangement according to an embodiment.

In 310, one or more power devices may be electrically conductively bonded onto one or more metal chip-carriers. First chip 108 may be electrically connected to first chip carrier 104. Third chip 114 may be electrically connected to second chip carrier 106.

First chip carrier 104 and second chip carrier 106 may be held a distance apart, in other words, they may be separated by separation distance $d_s$. Separation distance $d_s$ may range from about 10 μm to about 10 mm, e.g. from about 50 μm to about 5 mm, e.g. from about 100 μm to about 1 mm.

First chip carrier 104 may include a first lead frame carrier, and second chip carrier 106 may include a second lead frame carrier. First chip carrier 104 may include a first die pad, and second chip carrier 106 may include a second die pad.

First chip carrier 104 may have a thickness $t_1$ ranging from about 50 μm to about 1500 μm, e.g. about 100 μm to about 500 μm, e.g. about 150 μm to about 300 μm.

Second chip carrier 106 may have a thickness $t_2$ ranging from about 50 μm to about 1500 μm, e.g. about 100 μm to about 500 μm, e.g. about 150 μm to about 300 μm.

The whole lead frame of one device, may have a length $L_P$ from about 1 mm to 50 mm, e.g. about 2 mm to about 20 mm, and a breadth from about 1 mm to 50 mm, e.g. about 2 mm to about 20 mm.

At least one of first chip carrier 104 and second chip carrier 106 may include at least one from the following group of materials, the group of materials consisting of: copper, nickel, iron, silver, gold, palladium, phosphorous, copper alloy, nickel alloy, iron alloy, silver alloy, gold alloy, palladium alloy, phosphorous alloy.

At least one of first chip carrier 104 and second chip carrier 106 may include at least one from the following group of materials, the group of materials consisting of: NiPdAu, NiAu, NiPd, NiAuAg, NiPdAuAg, NiNiPPdAu, NiNiPAu, NiNiPPd, NiNiPAuAg, NiNiPPdAuAg.

At least one of first chip carrier 104 and second chip carrier 106 may include a material including a roughness ranging from about 1 nm to 1000 nm.

At least one of first chip carrier 104 and second chip carrier 106 may include a material having a porosity ranging from about 2% to 50%.

At least one of first chip 108 and third chip 114 may include a power semiconductor chip, wherein the power semiconductor chip may include at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

Figure 3A:
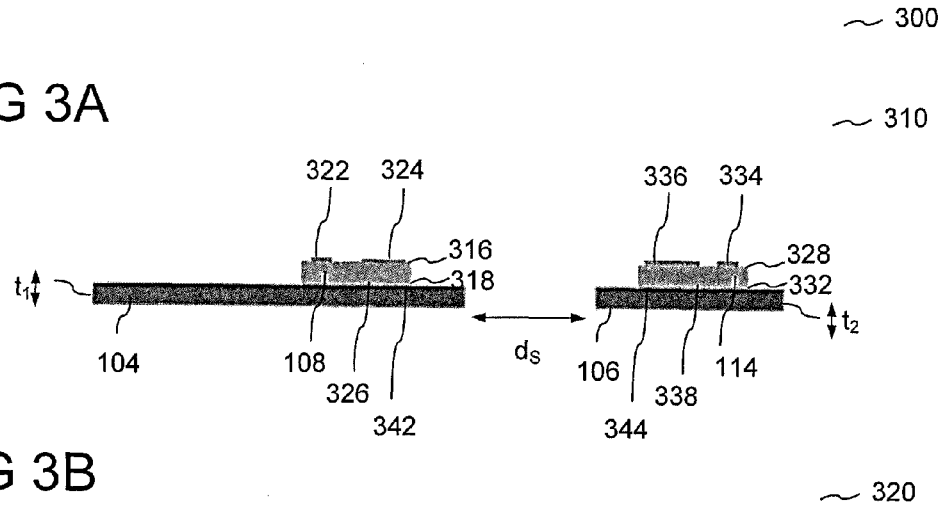
FIGS. 3A to 3D show a method for forming a chip arrangement according to an embodiment.
Figure 3B:
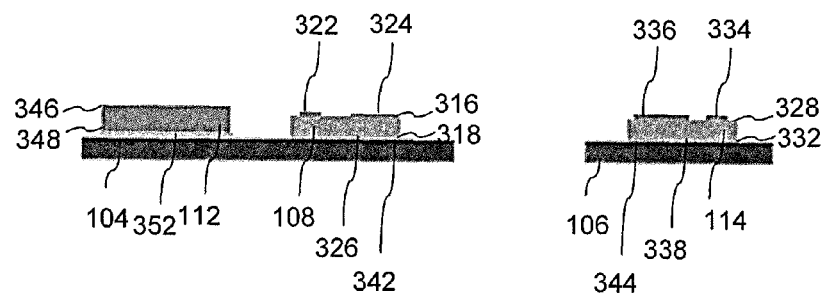

According to an embodiment, first chip 108 may include a power semiconductor chip. FIG. 3B shows that first chip 108 and third chip 114 may each include a power transistor. However, it may be understood that first chip 108 and/or third chip 114 may include a power transistor. Third chip 114 may include either a power semiconductor chip or a logic integrated circuit chip.

At least one of the first chip 108 and third chip 114 may include a power semiconductor device, wherein the power semiconductor device may be capable of carrying a voltage of up to approximately 600 V.

First chip 108 may include top side 316 and bottom side 318, wherein top side 316 may face a direction opposite to the direction which bottom side 318 faces.

First chip 108 may include a gate region contact 322 and at least one first source/drain region contact 324 formed over, e.g. directly on or indirectly on, top side 316, and at least one second source/drain region contact 326 formed over bottom side 318. Each of the contacts may include an electrically conductive contact pad. Each of the contacts may be electrically isolated from each other over top side 316 of first chip 108. For example, gate region contact 322 may be electrically isolated from at least one first source/drain region contact 324 by an electrically insulating material, e.g. silicon dioxide, formed over top side 316. Encapsulation materials, e.g. electrically insulating material 368 described hereinafter, may also be used to electrically isolate gate region contact 322 from at least one first source/drain region contact 324.

Top side may also be referred to as a "first side", "front side" or "upper side" of the chip. The terms "top side", "first side", "front side" or "upper side" may be used interchangeably hereinafter. Bottom side may also be referred to as "second side" or "back side" of the chip. The terms "second side", "back side", or "bottom side" may be used interchangeably hereinafter. As used herein with respect to semiconductor power devices, the terms "top side", "first side", "front side" or "upper side" may be understood to refer to the side of the chip wherein a gate region and at least one first source/drain region may be formed. The terms "second side", "back side", or "bottom side" may be understood to refer to the side of the chip wherein a second source/drain region may be formed. Therefore, a semiconductor power transistor may support a vertical current flow through the chip between a first source/drain region over top side 316 and a second source/drain region over bottom side 318.

Similarly, third chip 114 may include a semiconductor power transistor including top side 328 and bottom side 332. Similarly, third chip 114 may include gate region contact 334 and at least one first source/drain region contact 336 formed over top side 328, and at least one second source/drain region contact 338 formed over bottom side 332. First chip 108 may be configured to carry a vertical current flow between a first chip top side 316 and a first chip bottom side 318. Third chip 114 may be configured to carry a vertical current flow between a third chip top side 328 and a third chip bottom side 332. Gate region contact 334 may be electrically isolated from at least one first source/drain region contact 336 by an electrically insulating material, e.g. silicon dioxide, formed over top side 328. Encapsulation materials, e.g. electrically insulating material 368 described hereinafter, may also be used to electrically isolate gate region contact 334 from at least one first source/drain region contact 336.

First chip 108 may be disposed over first chip carrier 104, and first chip 108 may be electrically connected to first chip carrier 104 via at least one contact pad, e.g. second source/drain region contact 326 formed over first chip back side 318.

Similarly, third chip 114 may be disposed over second chip carrier 106, and third chip 114 may be electrically connected to second chip carrier 106 via at least one contact pad, e.g. second source/drain region contact 338 formed over third chip back side 332.

First chip 108 may be electrically connected to first chip carrier 104 via an electrically conductive medium 342.

Third chip 114 may be electrically connected to second chip carrier 106 via an electrically conductive medium 344.

Electrically conductive medium 342 and electrically conductive medium 344 may each include at least one from the following group of materials, the group consisting of: a solder, a soft solder, a diffusion solder, a paste, a nanopaste, an adhesive, an electrically conductive adhesive. Electrically conductive medium 342 and electrically conductive medium 344 may each include at least one from the following group of elements, the group of elements consisting of: Ag, Zn, Sn, Pb, Bi, In, Cu, Au, Pd.

Electrically conductive medium 342 and electrically conductive medium 344 may include the same or different materials.

In 320, one or more electrically insulated integrated circuit chip may each be electrically insulatively bonded onto at least one of first chip carrier 104 and second chip carrier 106. Second chip 112 may be disposed over first chip carrier 104. Second chip 112 may be electrically insulated from first chip carrier 104.

Second chip 112 may include top side 346 and bottom side 348. Second chip bottom side 348, i.e. back side, may be disposed over first chip carrier 104. Second chip 112 may include a semiconductor logic chip, wherein the semiconductor logic chip may include at least one semiconductor logic device from the group consisting of: an application specific integrated chip ASIC, a driver, a controller, a sensor. It may be understood that a semiconductor logic chip i.e. a logic integrated circuit chip, may include a low power semiconductor device, e.g. devices capable of carrying up to 100 V to 150 V.

As used herein with respect to lower power semiconductor logic devices, second chip top side 346, may be understood to refer to the side of the chip which carries one or more contact pads, or electrical contacts, wherein bonding pads or electrical connects may be attached; or wherein it is the side of the chip which may be mostly covered by metallization layers. Second chip bottom side 348 may be understood to refer to the side of the chip which may be free from metallization or contact pads or electrical contacts. Second chip bottom side 348 may be adhered to second chip carrier 104 by electrically insulating medium 352. Therefore, second chip 112 may be electrically insulated from first chip carrier 104 by electrically insulating medium 352. Electrically insulating medium 352 may include at least one from the following group of materials, the group consisting of: an adhesive, an electrically insulating adhesive, an epoxy, a glue, a paste, an adhesive foil, an electrically insulating wafer backside coating.

It may be understood that although according to various embodiments, first chip 108 is placed over first chip carrier 104 before second chip 112 is placed over first chip carrier 104, second chip 112 may be also be placed over first chip carrier 104 before first chip 108 is placed over first chip carrier 104.

First chip 108, second chip 112 and third chip 114 may each include a semiconductor chip, e.g. a die, which includes a wafer substrate. The semiconductor chip may include one or more electronic components formed over the wafer substrate. The wafer substrate may include various materials, e.g. semiconductor materials. The wafer substrate may include at least one from the following group of materials, the group of materials consisting of: Silicon, Germanium, Group III to V materials, polymers. According to an embodiment, the wafer substrate may include doped or undoped silicon. According to another embodiment, the wafer substrate may include a silicon on insulator SOI wafer. According to an embodiment, the wafer substrate may include a semiconductor compound material, e.g. gallium arsenide (GaAs), indium phosphide (InP). According to an embodiment, the wafer substrate may include a quaternary semiconductor compound material, e.g. indium gallium arsenide (InGaAs).

At least one of first chip 108, second chip 112 and third chip 114 may have a thickness (bottom side to top side) ranging from about 5 μm to about 500 μm, e.g. from about 10 μm to about 350 μm, e.g. from about 50 μm to about 250 μm.

At least one of first chip 108, second chip 112 and third chip 114 may have a length ranging from about 100 μm to 10 mm, e.g. about 200 μm to 8 mm, e.g. about 500 μm to about 5 mm.

At least one of first chip 108, second chip 112 and third chip 114 may have a breadth ranging from about 100 μm to 10 mm, e.g. about 200 μm to 8 mm, e.g. about 500 μm to about 5 mm.

In 330, at least one of first chip 108 and second chip 112 may be electrically connected to third chip 114. One or more electrical interconnects $354_1$, $354_2$ may be deposited together, e.g. by galvanic deposition. Electrically connecting at least one of first chip 108 and second chip 112 to third chip 114 may include forming an electrical interconnect $354_1$, for electrically connecting at least one of first chip 108 and second chip 112 to third chip 114. One or more electrical interconnects $354_1$, $354_2$ may include at least one material, element or alloy from the following group of materials, the group consisting of: copper, aluminum, silver, tin, gold, palladium, zinc, nickel, iron.

One or more electrical interconnects $354_1$, $354_2$ may be deposited, and one or more electrical interconnects $354_1$ may be configured to electrically connect at least one of first chip 108 and second chip 112 to third chip 114. At least one of the first chip 108 and second chip 112 may be electrically connected to at least one of a third chip top side 328 or third chip bottom side 332.

Figure 3C:
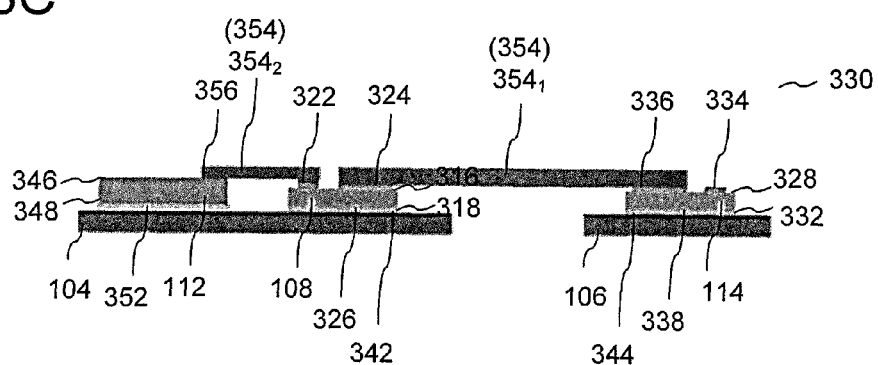
Figure 3D:
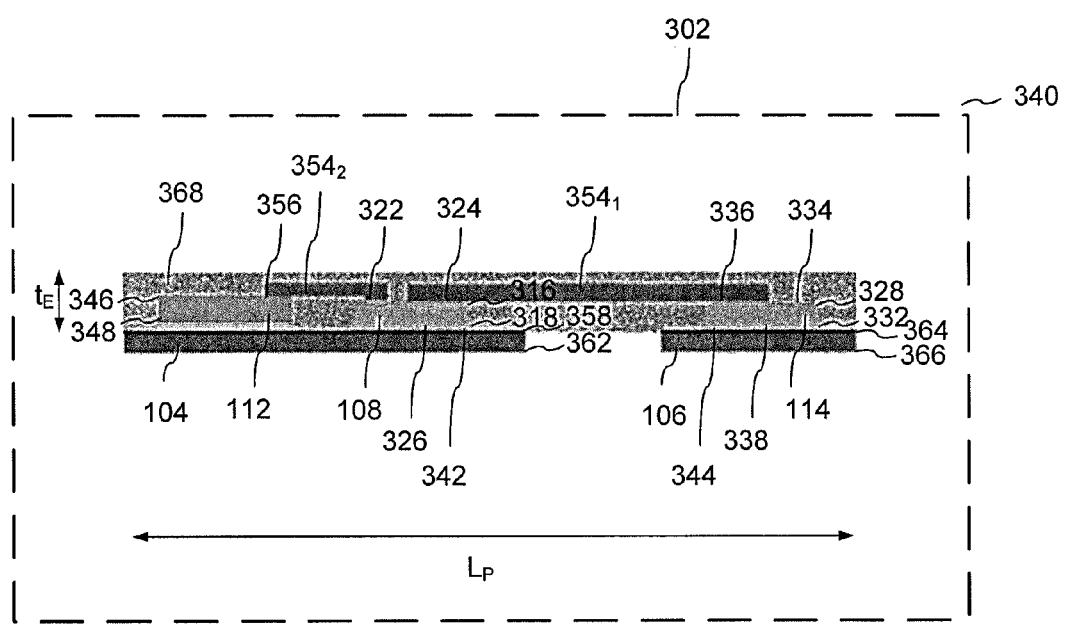

In FIG. 3C, electrical interconnect $354_1$ may be formed, such that it electrically connects first chip 108 to third chip 114, e.g. such that it electrically connects first chip top side 316 to third chip top side 328. Electrical interconnect $354_1$ may be formed, such that it electrically connects one or more contact pads 322, 324 formed over first chip front side 316 to one or more contact pads 334, 336 formed on third chip front side 328. For example, electrical interconnect $354_1$ may be formed, such that it electrically connects first chip first source/drain contact 324 to third chip first source/drain contact 336. One or more contact pads 322, 324 may include at least one material, element or alloy from the following group of materials, the group consisting of: copper, aluminum, silver, tin, gold, palladium, zinc, nickel, iron.

Second electrical interconnect $354_2$ may be formed, e.g. by galvanic deposition, such that it electrically connects one or more contact pads 322, 324 formed over first chip front side 316 to one or more contacts 356, e.g. contact pads, formed over second chip front side 346. For example, second electrical interconnect $354_2$ may be formed, such that it electrically connects first chip gate contact 322 to one or more contacts 356, formed over second chip front side 346. Each of the contacts 322, 324 may be electrically isolated from each other over first chip front side 316. For example, electrical contact 322 may be electrically isolated from electrical contact 324 by an electrically insulating material, e.g. silicon dioxide, formed over first chip front side 316. Encapsulation materials, e.g. electrically insulating material 368 described hereinafter, may also be used to electrically isolate electrical contact 322 from electrical contact 324.

One or more electrical interconnects $354_1$, $354_2$ may include at least one from the following group of electrical interconnects, the group consisting of: wires, electrically conductive wires, bond wires, clips, electrically conductive clips, galvanically deposited interconnects. One or more electrical interconnects $354_1$, $354_2$ in the form of wires, may be adhered to the chip contacts, e.g. contact pads, by means of an electrically conductive adhesive, e.g. a solder, e.g. a soft solder, e.g. a diffusion solder, e.g. a paste, e.g. an electrically conductive glue.

In 340, electrically insulating material 368 may be deposited. Electrically insulating material 368 may be deposited, such that electrically insulating material 368 may at least partially surround first chip 108, second chip 112 and third chip 114. Electrically insulating material 368 may be deposited between first chip 108 and second chip 112. Electrically insulating material 368 may be deposited between second chip 112 and third chip 114. Electrically insulating material 368 may be deposited between first chip carrier 104 and second chip carrier 106. Electrically insulating material 368 may be deposited, such that electrically insulating material 368 may at least partially surround first chip 108, second chip 112 and third chip 114. Electrically insulating material 368 may be deposited, such that electrically insulating material 368 may at least partially surround first chip carrier 104 and second chip carrier 106. Electrically insulating material 368 may be deposited, such that electrically insulating material 368 may at least partially surround one or more electrical interconnects $354_1$, $354_2$, where in one or more electrical interconnects $354_1$, $354_2$ may be configured to electrically connect at least one of first chip 108 and second chip 112 to third chip 114. Electrically insulating material 368 may be deposited, wherein first chip 108 may be electrically insulated from third chip 114, except for electrical interconnect $354_1$ which electrically connects first chip first source/drain contact 324 to third chip first source/drain contact 336.

Electrically insulating material 368 may include at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

Electrically insulating material 368 may have a thickness $t_E$ ranging from about 5 μm to about 500 μm, e.g. about 10 μm to about 300 μm, e.g. about 20 μm to about 150 μm.

First chip 108 and second chip 106 may be electrically connected to first chip carrier 104, i.e. over a top side 358 of first chip carrier 104. First chip 108 and second chip 106 may be electrically connected to first chip carrier 104, over a same side of first chip carrier 104. First chip carrier 104 may include first chip carrier bottom side 362, opposite to first chip carrier top side 358. Third chip 114 may be electrically connected to second chip carrier top side 364. Second chip carrier 106 may include second chip carrier bottom side 366, opposite to second chip carrier top side 364.

First chip carrier 104 and second chip carrier 106 may be arranged substantially level with each other, wherein first chip 108, second chip 112 and third chip 114 may be substantially level with each other.

Electrically insulating material 368 may be deposited, such that electrically insulating material 368 may at least partially surround first chip 108, second chip 112 and third chip 114, one or more electrical interconnects $354_1$, $354_2$, first chip carrier 104 and second chip carrier 106 from first chip carrier top side 358 and second chip carrier top side 364. Electrically insulating material 368 may be deposited such that electrically insulating material may hold first chip carrier 104 to second chip carrier 106, while separating first chip carrier 104 and second chip carrier 106 by separation distance $d_s$, and electrically isolating first chip carrier 104 from second chip carrier 106.

Electrically insulating material 368 may be deposited, such that electrically insulating material 368 may at least partially define one or more sides, e.g. exposed external-facing surfaces, of a chip package 302. In other words, electrically insulating material 368 may include at least one side which forms an external surface of the chip package.

First chip 108, second chip 108 and third chip 112 may form part of a half-bridge circuit, wherein second chip may include an integrated driver circuit for the half-bridge circuit.

Chip arrangement 302, e.g. chip package 302 may have a length $L_P$ ranging from about 1 mm to about 50 mm, e.g. from about 2 mm to about 20 mm, e.g. from about 3 mm to about 10 mm. Chip arrangement 302, e.g. chip package 302 may have a breadth (not shown) ranging from about 1 mm to about 50 mm, e.g. from about 2 mm to about 20 mm, e.g. from about 3 mm to about 10 mm.

Figure 4A:
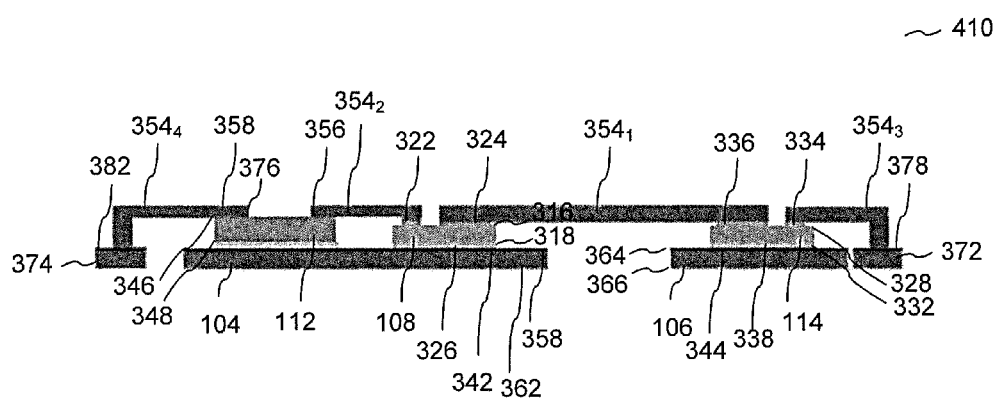
FIGS. 4A and 4B show a method for forming a chip arrangement according to an embodiment.
Figure 4B:
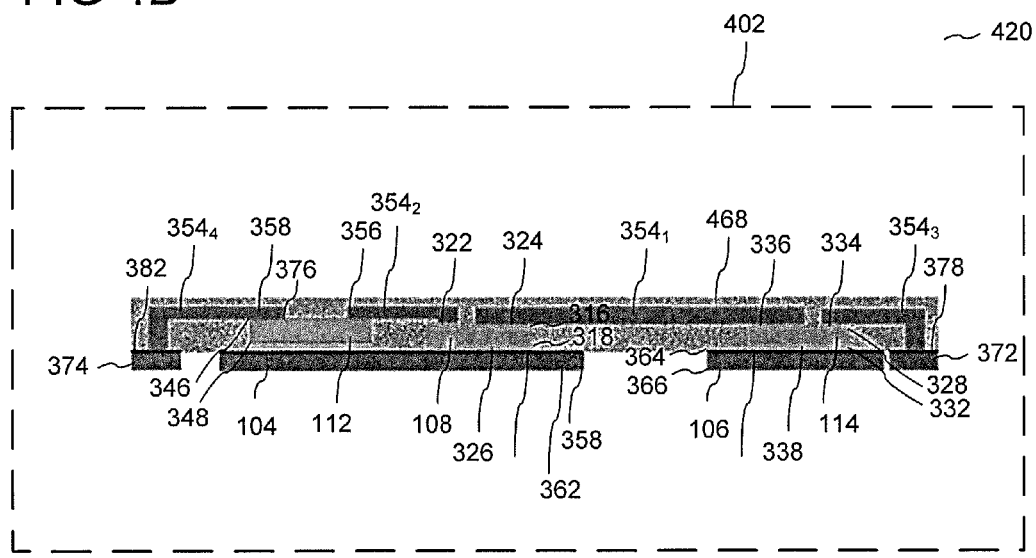

FIGS. 4A and 4B show a method for forming a chip arrangement according to an embodiment. Method 400 may include one or more or all of the processes already described with respect to at least one of method 200 and method 300. Method 400 may include one or more or all of the features described with respect to processes 310, 320, 330 and 340.

According to an embodiment, method 400 may include processes 310, 320, 330 and 340. In addition, in 410, method 400 may include depositing one or more further electrical interconnects $354_3$, $354_4$, e.g. by modifying process 330, wherein one or more further electrical interconnects $354_3$, $354_4$ may be configured to electrically connect at least one of first chip 108 and second chip 112 to one or more further chip carriers 372, 374. For example, electrical interconnect $354_3$ may be deposited wherein electrical interconnect $354_3$ may electrically connect third chip 114 to third chip carrier 372. Electrical interconnect $354_3$ may be deposited wherein electrical interconnect $354_3$ electrically connects third chip top side 328 to third chip carrier 372. Electrical interconnect $354_3$ may be deposited wherein electrical interconnect $354_3$ electrically connects third chip gate contact 334, or any other contact over third chip top side 328 to third chip carrier 372. One or more electrical interconnects $354_3$, $354_4$ may include at least one material, element or alloy from the following group of materials, the group consisting of: copper, aluminum, silver, tin, gold, palladium, zinc, nickel, iron.

Furthermore, electrical interconnect $35_{44}$ may be deposited wherein electrical interconnect $35_{44}$ electrically connects second chip 112 to fourth chip carrier 374. Electrical interconnect $35_{44}$ may be deposited wherein electrical interconnect $35_{44}$ electrically connects second chip top side 346 to fourth chip carrier 374. Electrical interconnect $35_{44}$ may be deposited wherein electrical interconnect $35_{44}$ electrically connects one or more contacts 376 over second chip top side 346 to fourth chip carrier 374. According to an embodiment, one or more contacts 356 may include a second chip first source/drain contact, and one or more contacts 376 may include a second chip second source/drain contact.

According to an embodiment, one or more further chips, further detailed hereinafter, may be attached to third chip carrier 372 and/or fourth chip carrier 374, wherein the one or more further chips may include one or more or all of the features of first chip 108 or second chip 112 or third chip 114.

In 420, electrically insulating material 468 may be deposited such that electrically insulating material 468 may at least partially surround first chip 108, second chip 112 and third chip 114. Electrically insulating material 468 may be deposited, such that electrically insulating material 468 may at least partially surround first chip carrier 104, second chip carrier 106, and one or more further chip carriers 372, 374. Electrically insulating material 468 may be deposited between first chip 108 and second chip 112. Electrically insulating material 468 may be deposited between second chip 112 and third chip 114. Electrically insulating material 468 may be deposited between first chip 108 and third chip 114. Electrically insulating material 468 may be deposited between first chip carrier 104 and second chip carrier 106. Electrically insulating material 468 may be deposited between second chip carrier 106 and third chip carrier 372. Electrically insulating material 468 may be deposited between first chip carrier 104 and fourth chip carrier 374. Electrically insulating material 468 may be deposited, such that electrically insulating material 468 may at least partially surround one or more electrical interconnects $354_1$, $354_2$, and one or more further electrical interconnects $354_3$, $354_4$. Electrically insulating material 368 may be deposited, wherein first chip 108 may be electrically insulated from second chip 112, except for electrical interconnect $354_2$ which electrically connects first chip gate contact 322 to second chip first source/drain contact 356.

Electrically insulating material 468 may include at the basic functionalities of the features described with respect to electrically insulating material 368. Electrically insulating material 468 may be deposited, such that electrically insulating material 468 may at least partially surround first chip 108, second chip 112 and third chip 114, one or more electrical interconnects $354_1$, $354_2$, and/or one or more further electrical interconnects $354_3$, $354_4$, first chip carrier 104 and second chip carrier 106, and/or one or more further chip carriers 372, 374, for example, from first chip carrier top side 358, second chip carrier top side 364 and/or one or more top sides 378, 382 of one or more further chip carriers 372, 374. Electrically insulating material 468 may be deposited such that electrically insulating material may hold first chip carrier 104, second chip carrier 106, third chip carrier 372 and fourth chip carrier 374 together, while separating and electrically isolating each of first chip carrier 104, second chip carrier 106, third carrier 372 and fourth chip carrier 374 from each other. Electrically insulating material 468 may be deposited, such that electrically insulating material 468 may at least partially define one or more sides, e.g. exposed external-facing surfaces, of a chip package 402.

Figure 5:
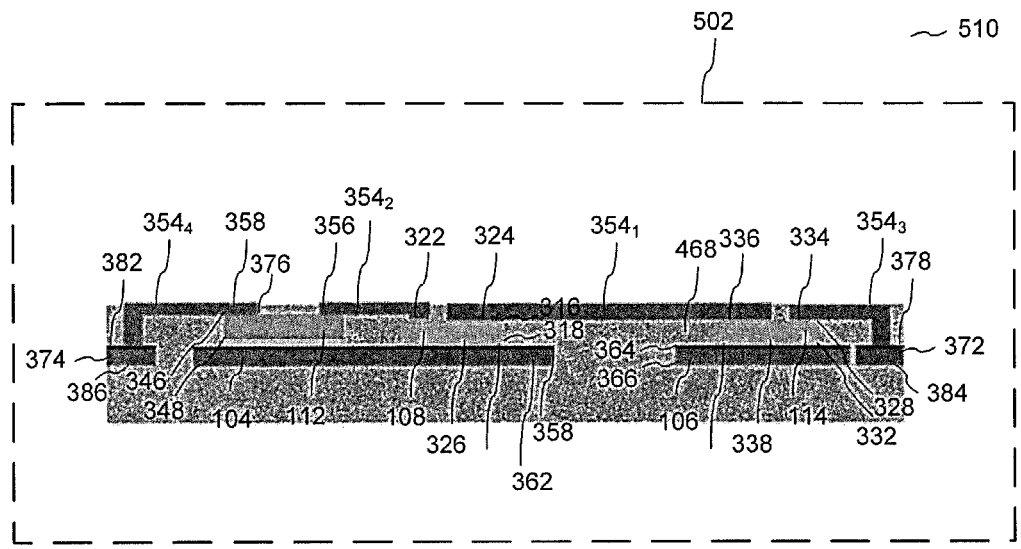
FIG. 5 shows a chip arrangement according to an embodiment.

FIG. 5 shows chip arrangement 502 according to an embodiment. According to various embodiments, electrically insulating material 368, 468, may be deposited from first chip carrier top side 358, second chip carrier top side 364 and one or more top sides 378, 382 of one or more further chip carriers 372, 374; thereby leaving first chip carrier bottom side 362, second chip carrier bottom side 384 and one or more bottom sides 384, 386 of one or more further chip carriers 372, 374 exposed (See FIG. 4C).

In 510, method 300 and/or method 400 may further include depositing electrically insulating material 368, 468, wherein electrically insulating material 368, 468 at least partially surrounds first chip carrier bottom side 362 and second chip carrier bottom side 366, as shown. Electrically insulating material 368, 468 may be deposited wherein electrically insulating material 368, 468 at least partially surrounds third chip carrier bottom side 384 and fourth chip carrier bottom side 386. According to an embodiment, electrically insulating material 368, 468 may, optionally, be selectively deposited wherein at least one surface of one or more electrical interconnects $354_1$, $354_2$, $354_3$, $354_4$ may be released, from electrically insulating material 368, 468. For example, at least one surface of one or more electrical interconnects $354_1$, $354_2$, $354_3$, $354_4$ may be uncovered by electrically insulating material 368, 468, and therefore exposed.

According to an embodiment, electrically insulating material 468, may be deposited, wherein first chip carrier 104, second chip carrier 106, third chip carrier 372, fourth chip carrier 374, first chip 108, second chip 112, third chip 114, and one or more electrical interconnects $354_1$, $354_2$, $354_3$, $354_4$ are fully embedded in electrically insulating material 468.

Figure 6:
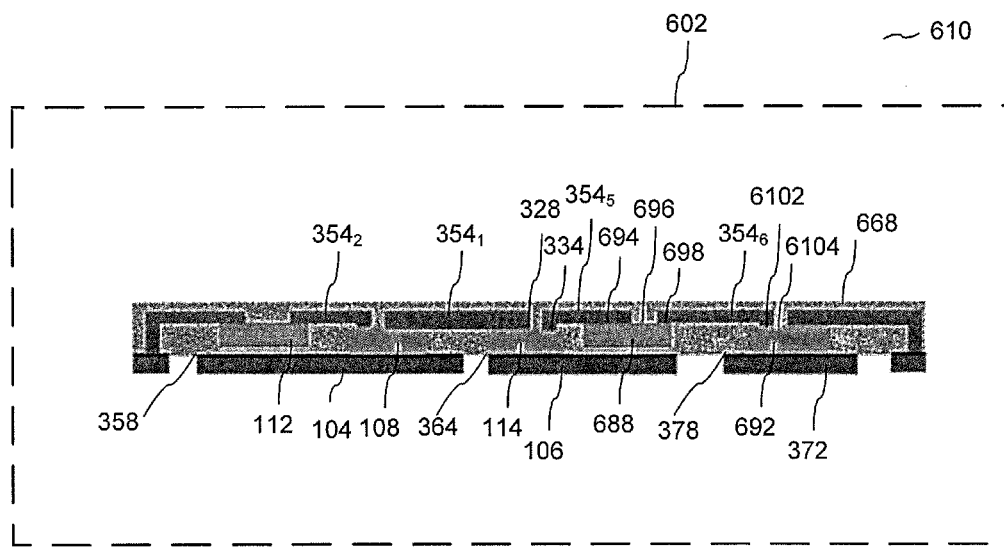
FIG. 6 shows a chip arrangement according to an embodiment.

FIG. 6 shows chip arrangement 602 according to an embodiment.

It may be understood that a chip arrangement, e.g. a chip package, according to various embodiments, may not be limited to including, one, two, three or four chip carriers.

Chip arrangement 602 may include the basic functionalities of one or more or all of the features of at least one of chip arrangements 102, 302, 402 and 502. In addition, chip arrangement 602 may include second chip carrier 106, wherein fourth chip 688 may be disposed over second chip carrier top side 364, in a process similar to the disposing of second chip 112 over first chip carrier 104. Fourth chip 688 may include a semiconductor logic integrated circuit chip as already described herein with respect to second chip 112.

Chip arrangement 602 may further include third chip carrier 372, wherein one or more chips may be formed over third chip carrier 372. In FIG. 6, fifth chip 692 may be electrically connected to third chip carrier 372, in a process similar to the electrical connection of first chip 108 to first chip carrier 104 and third chip 112 to second chip carrier 106. Fifth chip 692 may include a power semiconductor chip as already described herein with respect to first chip 108 or third chip 112.

Electrical interconnect $354_5$ may be formed, e.g. by galvanic deposition, such that it electrically connects one or more contacts 334 formed over third chip front side 328 to fourth chip 688. For example, electrical interconnect $354_5$ may be formed, such that it electrically connects third chip gate contact 334 formed over third chip front side 328 to one or more contacts 694, e.g. contact pads, formed over fourth chip front side 696.

Electrical interconnect $354_6$ may be formed, e.g. by galvanic deposition, such that it electrically connects one or more further contacts 698 formed over fourth chip front side 696 to fifth chip 692. For example, electrical interconnect $354_6$ may be formed, such that it electrically connects further contact 698 formed over fourth chip front side 696 to one or more contacts 6102, e.g. contact pads, formed over fifth chip front side 6104.

Electrically insulating material 668 may be deposited, such that electrically insulating material 668 may at least partially surround first chip 108, second chip 112, third chip 113, fourth chip 688, fifth chip 692, one or more electrical interconnects $354_1$, $354_2$, $354_5$, $354_6$, first chip carrier 104, second chip carrier 106, third chip carrier 372, first chip carrier top side 358, second chip carrier top side 364 and third chip carrier top side 378. Electrically insulating material 668 may be deposited between first chip 108 and second chip 112. Electrically insulating material 368 may be deposited between second chip 112 and third chip 114. Electrically insulating material 368 may be deposited between first chip 112 and third chip 114. Electrically insulating material 368 may be deposited between first chip carrier 104 and second chip carrier 106. Electrically insulating material 668 may be deposited, wherein first chip 108 may be electrically insulated from third chip 114, except for electrical interconnect $354_1$ which electrically connects first chip first source/drain contact 324 to third chip first source/drain contact 336. Electrically insulating material 668 may be deposited, wherein first chip 108 may be electrically insulated from second chip 112, except for electrical interconnect $354_2$ which electrically connects first chip second source/drain contact 322 to second chip first source/drain contact 356. Electrically insulating material 668 may be deposited, wherein third chip 114 may be electrically insulated from fourth chip 688, except for electrical interconnect $354_5$ which electrically connects one or more contacts 334 formed over third chip front side 328 to fourth chip 688. Electrically insulating material 668 may be deposited, wherein fourth chip 688 may be electrically insulated from fifth chip 692, except for electrical interconnect 354₆ which electrically connects one or more further contacts 698 formed over fourth chip front side 696 to fifth chip 692.

Electrically insulating material 668 may be deposited, such that electrically insulating material 668 may at least partially define one or more sides, e.g. exposed external-facing surfaces, of chip package 602. Electrically insulating material 668 may, optionally be formed to at least partially surround one or more respective bottom sides of the chip carriers. Electrically insulating material 468 may be deposited such that electrically insulating material may hold first chip carrier 104, second chip carrier 106 and third chip carrier 372 together, while separating and electrically isolating each of first chip carrier 104, second chip carrier 106 and third carrier 372 from each other.

Figure 7:
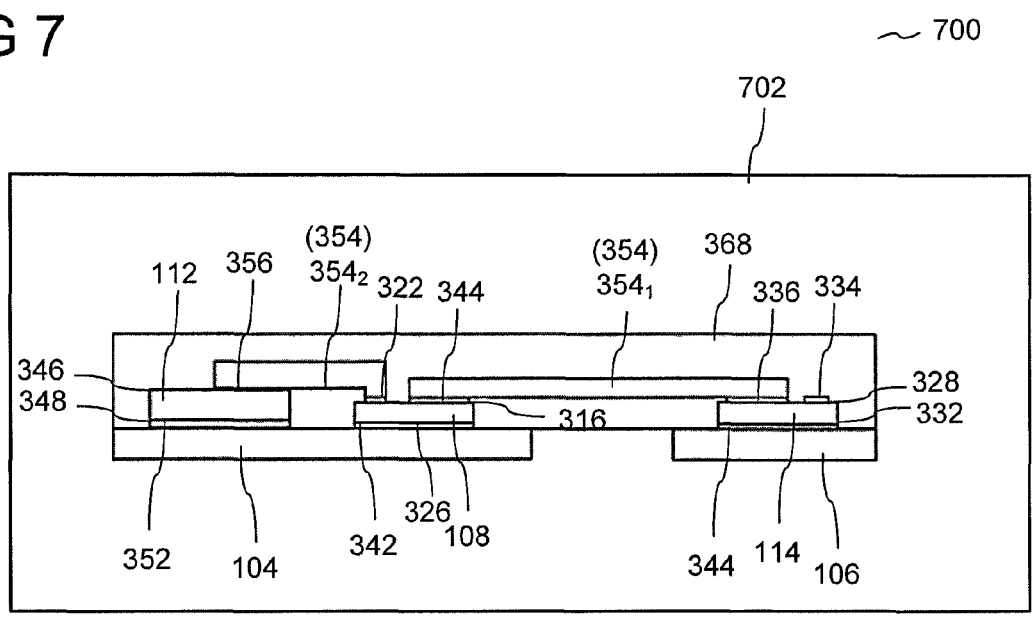
FIG. 7 shows a chip arrangement according to an embodiment.

FIG. 7 shows chip arrangement 702 according to an embodiment. Chip arrangement 702 may include the basic functionalities of one or more or all of the features of at least one of chip arrangements 102, 302, 402, 502 and 602.

Chip arrangement 702 may include first chip carrier 104 and second chip carrier 106. Chip arrangement 702 may include first chip 108 electrically connected to first chip carrier 104. Chip arrangement 702 may include second chip 112 disposed over first chip carrier 104 and electrically insulated from first chip carrier 104; and third chip 114 electrically connected to second chip carrier 106; wherein at least one of first chip 108 and second chip 112 is electrically connected to third chip 114.

At least one of the first chip 108 and second chip 112 may be electrically connected to at least one of a third chip top side 328 or third chip bottom side 332.

At least one of first chip 108 and third chip 114 may include a power semiconductor chip, wherein the power semiconductor chip may include at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

First chip 108 may be disposed over first chip carrier 104, and first chip 108 may be electrically connected to first chip carrier 104 via at least one contact pad 326 formed over first chip back side 318.

First chip 108 may be configured to carry a vertical current flow between a first chip top side 316 and a first chip bottom side 318. Third chip 114 may be configured to carry a vertical current flow between a third chip top side 328 and a third chip bottom side 332.

First chip 108 may be electrically connected to first chip carrier 104 via an electrically conductive medium 342, electrically conductive medium 342 including at least one from the following group of materials, the group consisting of: a solder, a soft solder, a diffusion solder, a paste, a nanopaste, an adhesive, an electrically conductive adhesive.

Second chip 112 may include a semiconductor logic chip. The semiconductor logic chip may include at least one semiconductor logic device from the group consisting of: an ASIC, a driver, a controller, a sensor.

Second chip back side 348 may be disposed over first chip carrier 104.

Second chip 112 may be electrically insulated from first chip carrier 104 by electrically insulating medium 352, electrically insulating medium 352 including at least one from the following group of materials, the group consisting of: an adhesive, an electrically insulating adhesive, an epoxy, glue, a paste, an adhesive foil, an electrically insulating wafer backside coating.

First chip carrier 104 may include a first lead frame carrier. Second chip carrier 106 may include a second lead frame carrier.

At least one of first chip carrier 104 and second chip carrier 106 may include at least one from the following group of materials, the group of materials consisting of: copper, nickel, iron, silver, gold, palladium, phosphorous, copper alloy, nickel alloy, iron alloy, silver alloy, gold alloy, palladium alloy, phosphorous alloy.

At least one of first chip carrier 104 and second chip carrier 106 may include at least one from the following group of materials, the group of materials consisting of: NiPdAu, NiAu, NiPd, NiAuAg, NiPdAuAg, NiNiPPdAu, NiNiPAu, NiNiPPd, NiNiPAuAg, NiNiPPdAuAg.

At least one of first chip carrier 104 and second chip carrier 106 may include a material including a roughness ranging from about 1 nm to 1000 nm.

At least one of first chip carrier 104 and second chip carrier 106 may include a material having a porosity ranging from about 2% to 50%.

Chip arrangement 702 may further include one or more electrical interconnects 354₁ configured to electrically connect at least one of first chip 108 and second chip 112 to third chip 114.

Chip arrangement 702 may further include one or more electrical interconnects 354, wherein first electrical interconnect 354₁ may be configured to electrically connect one or more contact pads 322, 324 formed over first chip front side 316 to one or more contact pads 334, 336 formed over third chip front side 328; and wherein second electrical interconnect 354₂ may be configured to electrically connect one or more contact pads 322, 324 formed over first chip front side 316 to one or more contact pads formed 356 over second chip front side 346.

One or more electrical interconnects 354₁, 354₂ may include at least one from the following group of electrical interconnects, the group consisting of: wires, electrically conductive wires, bond wire, clips, electrically conductive clips, bumps, galvanically deposited interconnects.

Chip arrangement 702 may further include electrically insulating material 368, wherein electrically insulating material 368 may at least partially surround first chip 108, second chip 112 and third chip 114.

Chip arrangement 702 may further include electrically insulating material 368, wherein electrically insulating material 368 may at least partially surround first chip carrier 104 and second chip carrier 106.

Chip arrangement 702 may further include electrically insulating material 368, wherein electrically insulating material 368 may at least partially surround one or more electrical interconnects 354₁, where in one or more electrical interconnects 354₁, may be configured to electrically connect at least one of first chip 108 and second chip 112 to third chip 114.

Chip arrangement 702 may further include electrically insulating material 368, wherein electrically insulating material 368 may at least partially surround first chip 108, second chip 112 and third chip 114, wherein electrically insulating material 368 may include at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

Electrically connecting at least one of first chip 108 and second chip 112 to third chip 114 may include forming one or more electrical interconnects 354, by galvanic deposition for electrically connecting at least one of first chip 108 and second chip 112 to third chip 114.

Figure 8:
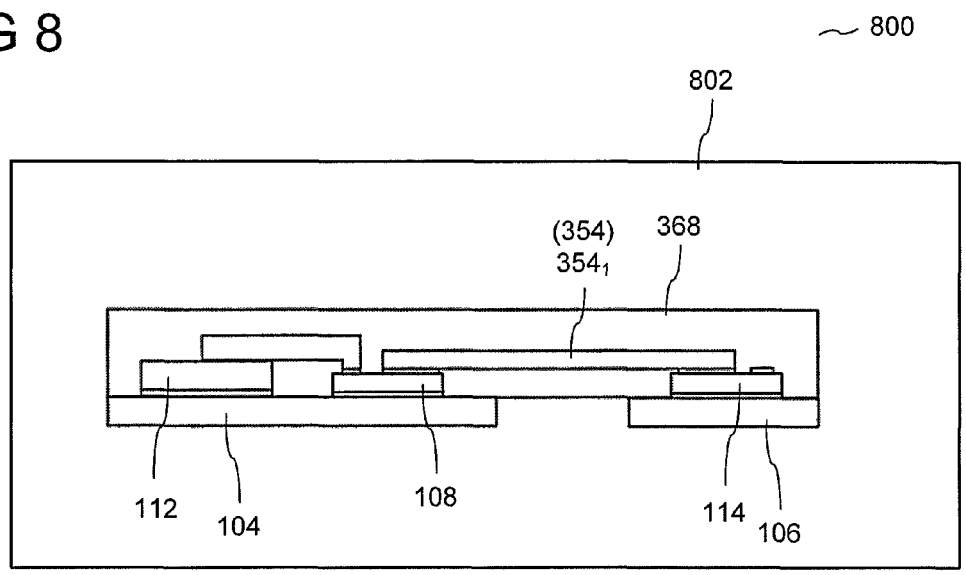
FIG. 8 shows a chip package according to an embodiment.

FIG. 8 shows chip package 802 according to an embodiment. Chip package 802 may include the basic functionalities of one or more or all of the features of at least one of chip arrangements 102, 302, 402, 502, 602 and 702.

Chip package 802 may include first chip carrier 104 and second chip carrier 106. Chip package 802 may include first chip 108 and second chip 112 disposed over first chip carrier 104. Chip package 802 may include third chip 114 disposed over second chip carrier 106. Chip package 802 may include electrically insulating material 368. At least one of first chip 108 and second chip 112 may be electrically connected to third chip 114 via one or more electrical interconnects $354_1$. Electrically insulating material 368 may at least partially surround first chip carrier 104, second chip carrier 106 and electrical interconnect $354_1$.

Figure 9:
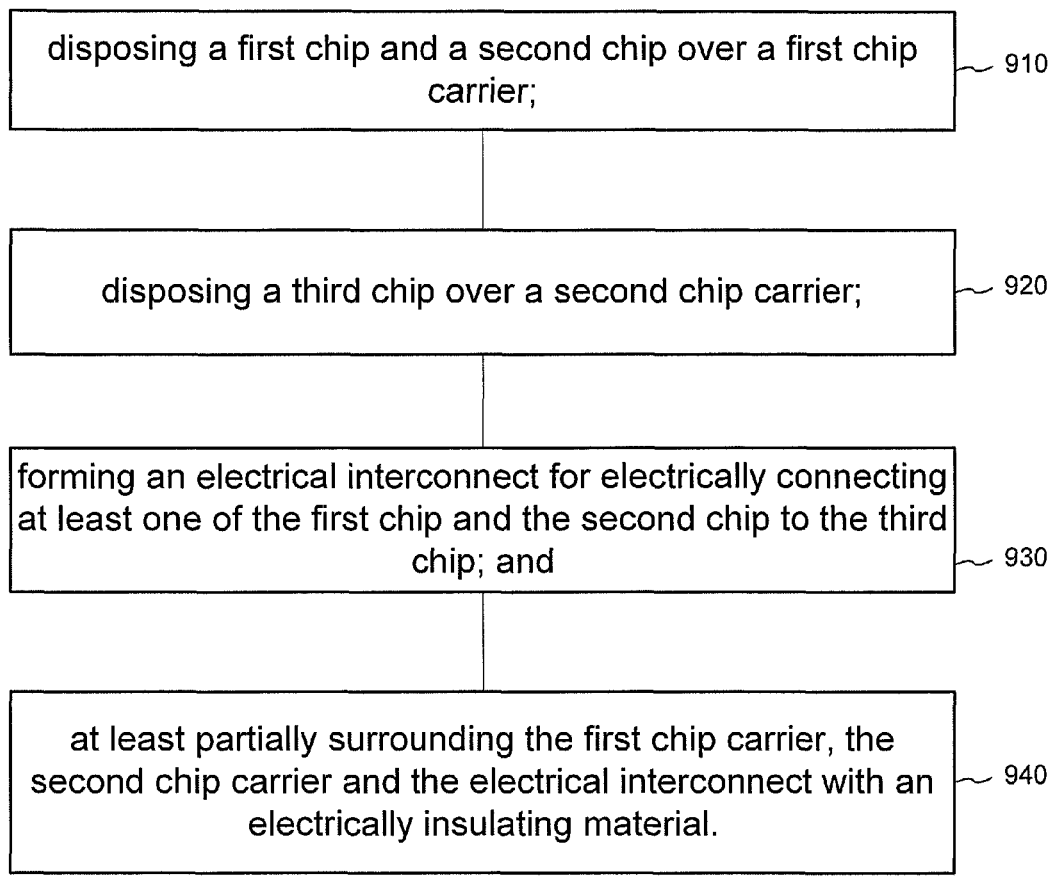
FIG. 9 shows a method for forming a chip package according to an embodiment.

FIG. 9 shows method 900 for forming a chip package according to an embodiment. Method 900 may include:

disposing a first chip and a second chip over a first chip carrier (in 910);

disposing a third chip over a second chip carrier (in 920);

forming an electrical interconnect for electrically connecting at least one of the first chip and the second chip to third chip (in 930); and at least partially surrounding the first chip carrier, the second chip carrier and the electrical interconnect with an electrically insulating material (940).

Figure 10:
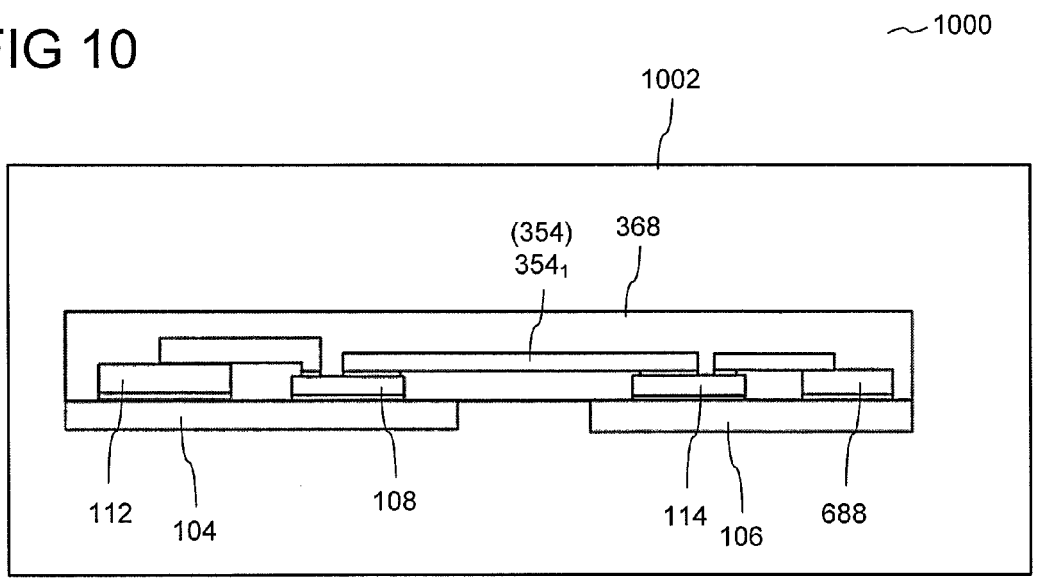
FIG. 10 shows a chip arrangement according to an embodiment.

FIG. 10 shows chip arrangement 1002 according to an embodiment.

Chip arrangement 102 may include first chip carrier 104 and second chip carrier 106. Chip arrangement 102 may include first chip 108, e.g. a semiconductor chip, e.g. a semiconductor die, electrically connected to first chip carrier 104. Chip arrangement 102 may include second chip 112, e.g. a semiconductor chip, e.g. a semiconductor die, disposed over first chip carrier 104 and electrically insulated from first chip carrier 104; third chip 114, e.g. a semiconductor chip, e.g. a semiconductor die, electrically connected to second chip carrier 106; fourth chip 688, e.g. a semiconductor chip, e.g. a semiconductor die, disposed over second chip carrier 106 and electrically insulated from second chip carrier 106; wherein at least one of first chip 108 and second chip 112 is electrically connected to at least one of third chip 114 and fourth chip 688.

Various embodiments provide a semiconductor housing with at least two metal carriers, i.e. die pads. At least one power semiconductor chip and at least one logic integrated circuit chip may be formed over each metal carrier. At least one power semiconductor chip may be configured to support a vertical current flow, wherein the back side of the power semiconductor chip may be electrically contacted to the chip carrier. A logic integrated circuit chip may be fixed over the chip carrier using an electrically insulating medium, e.g. an electrically insulating paste or adhesive foil.

Various embodiments provide integration of a plurality of power semiconductor chips and logic chips in an encapsulated housing, with a plurality of individually metallic chip carriers. Therefore, a higher integrations density is provided. Furthermore, the processes may be implemented, with parallel processes, and manufacturing in large quantities maybe possible, e.g. by a manufacturing process on large panels.

Various embodiments ensure that special or specifically modified lead frames may not be necessary, for example, lead frames need not be modified specifically for the logic chip to fit. Instead a standard lead frame may be used.

Various embodiments provide a multiple chip housing, including a plurality of chip carriers, wherein the plurality of chip carriers may be isolated from each other and electrically insulated from each other by an encapsulation material, e.g. a mold material, with or without filler particles, fiber-reinforced laminate, fiber-reinforced polymer laminate, fiber-reinforced polymer laminate with filler particles.

Various embodiments provide a single housing for a multiple chip circuit, including a power half-bridge circuit including a logic integrated circuit chip as a driver.

Various embodiments provide a chip arrangement, including: a first chip carrier; a second chip carrier; a first chip electrically connected to the first chip carrier; a second chip disposed over the first chip carrier and electrically insulated from the first chip carrier; and a third chip electrically connected to the second chip carrier; wherein at least one of the first chip and the second chip is electrically connected to the third chip.

According to an embodiment, at least one of the first chip and the second chip is electrically connected to at least one of a third chip top side or third chip bottom side.

According to an embodiment, at least one of the first chip and third chip includes a power semiconductor chip.

According to an embodiment, the power semiconductor chip includes at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

According to an embodiment, the first chip is configured to carry a vertical current flow between a first chip top side and a first chip bottom side.

According to an embodiment, the third chip is configured to carry a vertical current flow between a third chip top side and a third chip bottom side.

According to an embodiment, the first chip is disposed over the first chip carrier, and the first chip is electrically connected to the first chip carrier via at least one contact pad formed over a first chip back side.

According to an embodiment, the first chip is electrically connected to the first chip carrier via an electrically conductive medium, the electrically conductive medium including at least one from the following group of materials, the group consisting of: a solder, a soft solder, a diffusion solder, a paste, a nanopaste, an adhesive, an electrically conductive adhesive.

According to an embodiment, the second chip may include at least one of a semiconductor logic chip and a semiconductor memory chip.

According to an embodiment, the semiconductor logic chip includes at least one semiconductor logic device from the group consisting of: an ASIC, a driver, a controller, a sensor.

According to an embodiment, a second chip back side is disposed over the first chip carrier.

According to an embodiment, the second chip is electrically insulated from the first chip carrier by an electrically insulating medium, the electrically insulating medium including at least one from the following group of materials, the group consisting of: an adhesive, an electrically insulating adhesive, an epoxy, glue, a paste, an adhesive foil, an electrically insulating wafer backside coating.

According to an embodiment, the first chip carrier includes a first lead frame carrier, and wherein the second chip carrier includes a second lead frame carrier.

According to an embodiment, at least one of the first chip carrier and the second chip carrier includes at least one from the following group of materials, the group of materials consisting of: copper, nickel, iron, silver, gold, palladium, phosphorous, copper alloy, nickel alloy, iron alloy, silver alloy, gold alloy, palladium alloy, phosphorous alloy.

According to an embodiment, at least one of the first chip carrier and the second chip carrier includes at least one from the following group of materials, the group of materials consisting of: NiPdAu, NiAu, NiPd, NiAuAg, NiPdAuAg, NiNiPPdAu, NiNiPAu, NiNiPPd, NiNiPAuAg, NiNiPPdAuAg.

According to an embodiment, at least one of the first chip carrier and the second chip carrier includes a material including a roughness ranging from about 1 nm to 1000 nm.

According to an embodiment, at least one of the first chip carrier and the second chip carrier includes a material having a porosity ranging from about 2% to 50%.

According to an embodiment, chip arrangement further includes one or more electrical interconnects configured to electrically connect at least one of the first chip and the second chip to the third chip.

According to an embodiment, chip arrangement further includes one or more electrical interconnects, wherein a first electrical interconnect is configured to electrically connect one or more contact pads formed over a first chip front side to one or more contact pads formed over a third chip front side; and wherein a second electrical interconnect is configured to electrically connect one or more contact pads formed over a first chip front side to one or more contact pads formed over a second chip front side.

According to an embodiment, the one or more electrical interconnects includes at least one from the following group of electrical interconnects, the group consisting of: wires, electrically conductive wires, bond wires, clips, electrically conductive clips, bumps, galvanically deposited interconnects.

According to an embodiment, chip arrangement further includes an electrically insulating material, wherein the electrically insulating material at least partially surrounds the first chip, the second chip and the third chip.

According to an embodiment, chip arrangement further includes an electrically insulating material, wherein the electrically insulating material at least partially surrounds the first chip carrier and the second chip carrier.

According to an embodiment, chip arrangement further includes an electrically insulating material, wherein the electrically insulating material at least partially surrounds one or more electrical interconnects, where in the one or more electrical interconnects are configured to electrically connect at least one of the first chip and the second chip to the third chip.

According to an embodiment, chip arrangement further includes an electrically insulating material, wherein the electrically insulating material at least partially surrounds the first chip, the second chip and the third chip, wherein the electrically insulating material includes at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

Various embodiments provide a method for forming a chip arrangement, wherein the method provides: electrically connecting a first chip to a first chip carrier; disposing a second chip over the first chip carrier and electrically insulating the second chip from the first chip carrier; electrically connecting a third chip to the second chip carrier; and electrically connecting at least one of the first chip and the second chip to the third chip.

According to an embodiment, electrically connecting at least one of the first chip and the second chip to the third chip includes forming an electrical interconnect by galvanic deposition for electrically connecting at least one of the first chip and the second chip to the third chip.

Various embodiments provide a chip package, including: a first chip carrier; a second chip carrier; a first chip and a second chip disposed over the first chip carrier; a third chip disposed over the second chip carrier; and an electrically insulating material; wherein at least one of the first chip and the second chip is electrically connected to the third chip via one or more electrical interconnects, and wherein the electrically insulating material at least partially surrounds the first chip carrier, the second chip carrier and the electrical interconnect.

Various embodiments provide a method for forming a chip package, the method including: disposing a first chip and a second chip over a first chip carrier; disposing a third chip over a second chip carrier; forming an electrical interconnect for electrically connecting at least one of the first chip and the second chip to the third chip; and at least partially surrounding the first chip carrier, the second chip carrier and the electrical interconnect with an electrically insulating material.

According to an embodiment, forming an electrical interconnect for electrically connecting at least one of the first chip and the second chip to the third chip includes depositing galvanically an electrically conductive material for electrically connecting at least one of the first chip and the second chip to the third chip.

Various embodiments provide a chip arrangement, including: a first chip carrier; a second chip carrier; a first chip electrically connected to the first chip carrier; a second chip disposed over the first chip carrier and electrically insulated from the first chip carrier; and a third chip electrically connected to the second chip carrier; a fourth chip disposed over the second chip carrier and electrically insulated from the second chip carrier; and wherein at least one of the first chip and the second chip is electrically connected to at least one of the third chip and the fourth chip.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip arrangement, comprising:
a first chip carrier;
a second chip carrier;
a first chip electrically connected to the first chip carrier;
a second chip disposed over the first chip carrier and electrically insulated from the first chip carrier; and
a third chip electrically connected to the second chip carrier;
wherein at least one of the first chip and the second chip is electrically connected to the third chip; and
wherein at least one of the first chip carrier and the second chip carrier comprises a material comprising a roughness ranging from about 1 nm to 1000 nm.

2. The chip arrangement according to claim 1, wherein at least one of the first chip and the second chip is electrically connected to at least one of a third chip top side or third chip bottom side.

3. The chip arrangement according to claim 1,
wherein at least one of the first chip and third chip comprises a power semiconductor chip.

4. The chip arrangement according to claim 3,
wherein the power semiconductor chip comprises at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

5. The chip arrangement according to claim 3,
wherein the first chip is configured to carry a vertical current flow between a first chip top side and a first chip bottom side.

6. The chip arrangement according to claim 3,
wherein the third chip is configured to carry a vertical current flow between a third chip top side and a third chip bottom side.

7. The chip arrangement according to claim 1,
wherein the first chip is disposed over the first chip carrier, and
wherein the first chip is electrically connected to the first chip carrier via at least one contact pad formed over a first chip back side.

8. The chip arrangement according to claim 1,
wherein the first chip is electrically connected to the first chip carrier via an electrically conductive medium, the electrically conductive medium comprising at least one from the following group of materials, the group consisting of: a solder, a soft solder, a diffusion solder, a paste, a nanopaste, an adhesive, an electrically conductive adhesive.

9. The chip arrangement according to claim 1,
wherein the second chip comprises at least one of a semiconductor logic chip and a semiconductor memory chip.

10. The chip arrangement according to claim 9,
wherein the semiconductor logic chip comprises at least one semiconductor logic device from the group consisting of: an ASIC, a driver, a controller, a sensor.

11. The chip arrangement according to claim 1,
wherein a second chip back side is disposed over the first chip carrier.

12. The chip arrangement according to claim 1,
wherein the second chip is electrically insulated from the first chip carrier by an electrically insulating medium, the electrically insulating medium comprising at least one from the following group of materials, the group consisting of: an adhesive, an electrically insulating adhesive, an epoxy, glue, a paste, an adhesive foil, an electrically insulating wafer backside coating.

13. The chip arrangement according to claim 1,
wherein the first chip carrier comprises a first lead frame carrier, and
wherein the second chip carrier comprises a second lead frame carrier.

14. The chip arrangement according to claim 1,
wherein at least one of the first chip carrier and the second chip carrier comprises at least one from the following group of materials, the group of materials consisting of: copper, nickel, iron, silver, gold, palladium, phosphorous, copper alloy, nickel alloy, iron alloy, silver alloy, gold alloy, palladium alloy, phosphorous alloy.

15. The chip arrangement according to claim 1,
wherein at least one of the first chip carrier and the second chip carrier comprises at least one from the following group of materials, the group of materials consisting of: NiPdAu, NiAu, NiPd, NiAuAg, NiPdAuAg, NiNiPPdAu, NiNiPAu, NiNiPPd, NiNiPAuAg, NiNiPPdAuAg.

16. The chip arrangement according to claim 1,
wherein at least one of the first chip carrier and the second chip carrier comprises a material having a porosity ranging from about 2% to 50%.

17. The chip arrangement according to claim 1, further comprising
one or more electrical interconnects configured to electrically connect at least one of the first chip and the second chip to the third chip.

18. The chip arrangement according to claim 1, further comprising
one or more electrical interconnects,
wherein a first electrical interconnect is configured to electrically connect one or more contact pads formed over a first chip front side to one or more contact pads formed over a third chip front side; and
wherein a second electrical interconnect is configured to electrically connect one or more contact pads formed over a first chip front side to one or more contact pads formed over a second chip front side.

19. The chip arrangement according to claim 17,
wherein the one or more electrical interconnects comprises at least one from the following group of electrical interconnects, the group consisting of: wires, electrically conductive wires, bond wires, clips, electrically conductive clips, bumps, galvanically deposited interconnects.

20. The chip arrangement according to claim 1, further comprising:
an electrically insulating material,
wherein the electrically insulating material at least partially surrounds the first chip, the second chip and the third chip.

21. The chip arrangement according to claim 1, further comprising:
an electrically insulating material,
wherein the electrically insulating material at least partially surrounds the first chip carrier and the second chip carrier.

22. The chip arrangement according to claim 1, further comprising:
an electrically insulating material,
wherein the electrically insulating material at least partially surrounds one or more electrical interconnects, where in the one or more electrical interconnects are configured to electrically connect at least one of the first chip and the second chip to the third chip.

23. The chip arrangement according to claim 1, further comprising:
an electrically insulating material,
wherein the electrically insulating material at least partially surrounds the first chip, the second chip and the third chip,
wherein the electrically insulating material comprises at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

24. A chip package, comprising:
a first chip carrier;
a second chip carrier;

a first chip and a second chip disposed over the first chip carrier;

a third chip disposed over the second chip carrier; and an electrically insulating material;

wherein at least one of the first chip and the second chip is electrically connected to the third chip via one or more electrical interconnects, and wherein the electrically insulating material at least partially surrounds the first chip carrier, the second chip carrier and the electrical interconnect; and wherein at least one of the first chip carrier and the second chip carrier comprises a material comprising a roughness ranging from about 1 nm to 1000 nm.

25. A chip arrangement, comprising;

a first chip carrier;

a second chip carrier;

a first chip electrically connected to the first chip carrier;

a second chip disposed over the first chip carrier and electrically insulated from the first chip carrier; and a third chip electrically connected to the second chip carrier;

a fourth chip disposed over the second chip carrier and electrically insulated from the second chip carrier; and wherein at least one of the first chip and the second chip is electrically connected to at least one of the third chip and the fourth chip, and wherein at least one of the first chip carrier and the second chip carrier comprises a material comprising a roughness ranging from about 1 nm to 1000 nm.

\* \* \* \* \*